United States Patent [19]

Hayase et al.

[11] Patent Number: 4,835,193

[45] Date of Patent: May 30, 1989

[54] PHOTOPOLYMERIZABLE EPOXY RESIN COMPOSITION

[75] Inventors: Shuzi Hayase, Kawasaki; Yasunobu Onishi; Shuichi Suzuki, both of Yokohama; Moriyasu Wada, Ninomiya, all of Japan

[73] Assignee: Kabushiki Kaisha Toshiba, Kawasaki, Japan

[21] Appl. No.: 47,501

[22] Filed: May 7, 1987

Related U.S. Application Data

[63] Continuation of Ser. No. 655,424, Sep. 28, 1984, abandoned.

[30] Foreign Application Priority Data

Sep. 30, 1983 [JP] Japan .................. 58-180400

[51] Int. Cl.$^4$ .................. C08G 59/68; C08K 5/08
[52] U.S. Cl. .................. 522/15; 522/8; 522/25; 522/31; 522/47; 522/48; 522/166; 522/170
[58] Field of Search .............. 522/31, 15, 25, 31

[56] References Cited

U.S. PATENT DOCUMENTS

| | | | |
|---|---|---|---|
| 2,895,892 | 7/1959 | Chalkley | 252/600 |
| 3,211,553 | 10/1965 | Ito | 430/293 |
| 3,708,296 | 1/1973 | Schlesinger | 96/33 |
| 4,154,872 | 5/1979 | Tsao | 204/159.11 |
| 4,196,136 | 4/1980 | Knoth | 556/14 |
| 4,339,567 | 7/1982 | Green | 204/159.11 |
| 4,482,489 | 11/1984 | Dipippo | 204/159.11 |
| 4,495,042 | 1/1985 | Hayase et al. | 204/159.11 |

FOREIGN PATENT DOCUMENTS

| | | |
|---|---|---|
| 0011918 | 6/1980 | European Pat. Off. . |
| 57-429 | 4/1983 | Japan . |
| 118816 | 7/1983 | Japan . |
| 2034317 | 6/1980 | United Kingdom . |
| 2034318 | 6/1980 | United Kingdom . |

OTHER PUBLICATIONS

Bal et al., "Photopolymerization of 1,2-epoxypropane . . . "; Polymer, vol. 21, Apr. 1980, pp. 423–428.

Obara, "Curable Resin Composition", Chemical Abstract, vol. 100(4): 23256k, 1983 for JP 58/118816.

"Inorganic Chemistry", Thorne et al, Nordeman Pub. Co., N.Y., 1943, Fourth Ed., pp. 500-511.

Crivello, J. V. and Lam, J. H. W., Macromolecules, 10, 1307 (1977).

Crivello, J. V. and Lam, J. H. W., Journal of Polymer Science, Polymer Chemistry edition, 17, 2877 (1979).

*Primary Examiner*—John C. Bleutge
*Assistant Examiner*—Arthur H. Koeckert
*Attorney, Agent, or Firm*—Foley & Lardner Schwartz, Jeffery, Schwaab, Mack, Blumenthal & Evans

[57] ABSTRACT

A photopolymerizable epoxy resin composition comprising (a) an epoxy resin and (b) a heteropoly-acid aromatic sulfonium salt or a heteropoly-acid aromatic iodonium salt as a photocuring catalyst exhibits rapid photopolymerization, with the cured product being great in hardness, the corrosive action being weak, and the electrical properties being excellent. The industrial utility of the composition is therefore substantial.

16 Claims, No Drawings

PHOTOPOLYMERIZABLE EPOXY RESIN COMPOSITION

This application is a continuation of application Ser. No. 655,424, filed Sept. 28, 1984, now abandoned.

BACKGROUND OF THE INVENTION

This invention relates to a photopolymerizable epoxy resin composition having a novel composition, more particularly to an epoxy resin composition having good photo-curability, less corrosive properties and excellent electrical characteristics.

In the specifications of U.S. Pats. Nos. 3,205,156 and No. 3,708,296, there are disclosed light-susceptible epoxy resin compositions containing an aryldiazonium salt and an aryldiazonium salt of a halogen-containing complex anion, respectively. These compositions are restricted in their availabilities for reasons of (1) less thermal stability, (2) spectral responses limited to an unltraviolet region of spectrum, and (3) the occurrence of pinholes and air bubbles in a cured composition due to the generation of nitrogen during photopolymerization.

Also when oxetane or a mixture of oxetane and an epoxy resin is photopolymerized by the use of aforesaid aryldiazonium salt, the same problem as mentioned above will arise (see the specification of U.S. Pat. No. 3,835,003).

Some patents (see specifications of U.S. Pat. Nos. 3,711,390, 3,711,931, 3,816,278, 3,817,850 and 3,817,845) disclose methods for stabilizing mixtures of diazonium salts and epoxides. These methods, however, are unsatisfactory for several reasons. For example, with regard to their stability, its good state can merely be retained for so short a period as to be represented by the unit of days, and the addition of a stabilizer, which is a non-reactive material, will contaminate a desired composition, with the consequence that this added material will soften a product thereof and will deteriorate a photo-setting speed.

Further, in the specification of U.S. Pat. No. 3,450,613, there is disclosed a photopolymerizable epoxy resin composition comprising a reaction product of an epoxy resin prepolymer and an ethylenically unsaturated organic acid, a light-susceptible agent and optionally a poly-functional acid or hydrochloric acid.

The gelation of this composition can be accomplished by the photopolymerization of an ethylenically unsaturated portion in the reaction product when exposed to ultraviolet rays, but for the sake o the complete cure of the composition, it is necessary that an epoxy resin portion of the composition is caused to carry out a curing reaction. For this purpose, it is finally required to give a thermal treatment to the composition. In other words, in order to accomplish the complete polymerization (curing) of this composition, both light and heat are needful. For this reason, applicable fields of the composition are inevitably limited. In addition thereto, this composition has the problems of being sensitive to enzymes and being low in thermal stability.

On the other hand, as photo-setting catalysts for the photopolmerizable epoxy resin composition, complexes represented by the following formula are known:

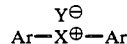

wherein
Ar is a phenyl group or the like;
X is an iodine atom, sulfur atom diazo group of the like; and
Y is a BF$_4$, PF$_6$, AsF$_6$, SbF$_6$ or the like.
[see, for example, Macromolecules, Vol. 10, p. 1307 (1977); Journal of Radiation Curing, Vol. 5, p. 2 (1978); Journal of Polymer Science, Polymer Chemistry Edition, Vol. 17, p. 2877 (1979); Ibid. Vol. 17, p. 1047 (1979); Journal of Polymer Science, Polymer Letters Edition, Vol. 17, p. 759 (1979); Japanese Provisional Patent Publication No. 65219/1980; U.S. Pat. No. 4,069,054; and British Pats. Nos. 1,516,511 and 1,518,141.]

However, when the photopolymerization of the epoxy resin is carried out with this photo-setting catalyst, the cured material will be improved in mechanical properties, but on the other hand, if used in the field of electric applicances, the cured material will inevitably deteriorate in electrical insulating properties and will corrode peripheral parts, because the added catalyst functions as an ionic impurity.

SUMMARY OF THE INVENTION

An object of this invention is to provide a novel photopolymerizable composition which can overcome the aforesaid problems inherent in a photopolymerizable epoxy resin composition, has excellent photo-setting properties and a less corrosive action, and permits giving satisfactory electrical properties to a prepared cured material.

A photopolymerizable epoxy resin composition of this invention is characterized by comprising an epoxy resin and an aromatic sulfonium salt of a heteropoly-acid or an aromatic iodonium salt of a heteropoly-acid.

DESCRIPTION OF THE PREFERRED EMBODIMENTS

Examples of the epoxy resins to be used in this invention include a bisphenol A type epoxy resin; a bisphenol F type epoxy resin; a phenol-novolac type epoxy resin; an alicyclic epoxy resin; a heterocyclic ring-containing epoxy resin such as triglycidyl isocyanurate, hydantoin epoxy, or the like; a hydrogenated bisphenol A type epoxy resin; an aliphatic epoxy resin such as propylene glycoldiglycidyl ether, pentaerythritol-polyglycidyl ether or the like; a glycidyl ester type epoxy resin obtained by the reaction of an aromatic, aliphatic or alicyclic carboxylic acid with epichlorohydrin; a spiro ringcontaining epoxy resin; a glycidyl ether type epoxy resin which is a reaction product of an o-allyl-phenolnovolac compound and epichlorohydrin; a glycidyl ether type epoxy resin which is a reaction product of a diallyl bisphenol compound, having an allyl group at the o-position of each of the hydroxyl groups in bisphenol A, and epichlorohydrin; etc.

The heteropoly-acid aromatic sulfonium salt to be used in this invention is one of an essential component as a photopolymerization initiator.

This heteropoly-acid aromatic sulfonium salt is a compound generally represented by the following formula:

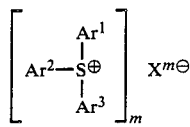

wherein $Ar^1$ to $Ar_3$ may be the same or different from each other, and each represents an aromatic group such as a phenyl group or a naphthyl group; or an aromatic group substituted with at least one substituent selected from the group consisting of a halogen atom, an alkyl group, an alkoxy group, an aralkyl group, an aryloxy group, an arylthio group and a nitro group; $X^{m\ominus}$ represents an anion of the heteropoly-acid; and m is an integer of 3 to 5.

Examples of the anions $X^{m\ominus}$ of the heteropoly-acid include a phosphotungstate, a phosphomolybdate, a tungstogermanate, a silicotungstate, a silicomolybdate and the like.

Concrete examples of the heteropoly-acid aromatic sulfonium salt to be used in this invention include triphenylsulfonium phosphomolybdate, triphenylsulfonium phosphotungstate, triphenylsulfonium silicotungstate, tri(methoxyphenyl)sulfonium phosphotungstate, tri(methoxyphenyl)sulfonium silicomolybdate, tri(tert-butylphenyl)sulfonium photphotungstate, tritolylsulfonium phosphotungstate, tri(2-naphthyl)sulfonium phosphotungstate and the like. Preferably, a phosphotungstate such as triphenylsulfonium phosphotungstate is employed.

The heteropoly-acid aromatic iodonium salt to be used in this invention is another essential component as a photopolymerization initiator.

This heteropoly-acid aromatic iodonium salt is a compound represented by the following formula:

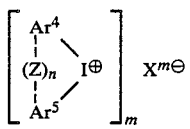

wherein $Ar^4$ and $Ar^5$ may be the same or different from each other, and each represents a substituted or unsubstituted aromatic group or heterocyclic group each having 6 to 20 carbon atoms; Z represents optional presence of an oxygen atom, a sulfur atom,

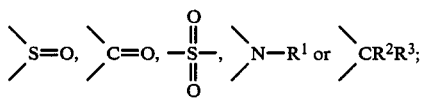

wherein $R^1$ represents a hydrogen atom, an alkyl group having 1 to 10 carbon atoms or an acyl group having 1 to 5 carbon atoms; and $R^2$ and $R^3$ may be the same or different from each other, and each represents a hydrogen atom, an alkyl group having 1 to 4 carbon atoms or a alkenyl group having 2 to 4 carbon atoms;

$X^{m\ominus}$ represents an anion of the heteropoly-acid; m is an integer of 3 to 5; n is an integer of 0 or 1; and dotted line represents optional presence of bonding when n=1.

In the formula, examples of the aromatic group or the heterocyclic group represented by $Ar^4$ or $Ar^5$ include a phenyl group, a thienyl group, a furanyl group, a pyrazolyl group and the like. These aromatic groups may have one or more condensed benzene ring such as a condensed carbon-hydrogen ring, e.g. naphthyl; a sulfur containing condensated heterocyclic ring, e.g. benzothienyl, dibenzothienyl, etc.; and an oxygen-containing condensated heterocyclic ring, e.g. benzofuranyl, dibenzofuranyl, etc.

These aromatic groups may optionally be substituted by one or more substituents as described below. Such a substituent include a halogen atom, a nitro group, a hydroxy group, a carboxyl group, an anilino group or N-alkylanilino group, an ester group (e.g. an alkoxycarbonyl such as methoxycarbonyl or ethoxycarbonyl, a phenoxycarbonyl), a sulfo ester group (e.g. an alkoxysulfonyl such as methoxysulfonyl or ethoxysulfonyl, a phenoxysulfonyl), an amido group (e.g. an acetamide, a butylamide, an ethylsulfonamide), a carbamyl group (e.g. a carbamyl, an N-alkylcarbamyl, an N-phenylcarbamyl), a sulfamyl group (e.g. a sulfamyl, an N-alkylsulfamyl, an N,N-dialkylsulfamyl, an N-phenylsulfamyl), an alkoxy group (e.g. a methoxy, an ethoxy, a butoxy), an aryl group (e.g. a phenyl), an alkyl group (e.g. a methyl, an ethyl, a butyl), an aryloxy group (e.g. a henoxy), an alkylsulfonyl group (e.g. a methylsulfonyl, an ethylsufonyl), an arylsulfonyl group (e.g. a phenylsulfonyl), a perfluoroalkyl group (e.g. a trifluoromethyl, a perfluoroethyl) and a perfluoroalkylsulfonyl group (e.g. a trifluoromethylsulfonyl, a perfluorobutylsulfonyl).

In the formula, $Ar^4$ and $Ar^5$ may be bonded by an oxygen atom, a sulfur atom,

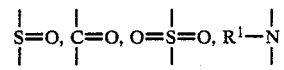

wherein $R^1$ represents a hydrogen atom, a lower alkyl group having 1 to 10 carbon atoms, an acyl group such as an acetyl or a benzoyl), or

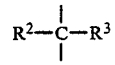

(wherein $R^2$ and $R^3$ may be the same or different and each represents a hydrogen atom, an alkyl group having 1 to 4 carbon atoms or an alkenyl group having 2 to 4 carbon atoms).

In the formula, $X^{m\ominus}$ has the same meaning as defined above.

Concrete examples of the heteropoly-acid aromatic iodonium salt to be used in this invention include diphenyliodonium phosphomolybdate, diphenyliodonium phosphotungstate, di(4-methylphenyl)iodonium phosphosilicotungstate, di(4-heptylphenyl)iodonium tungstogermanate, di(5-nitrophenyl)iodonium phosphotungstate, di(4-chlorophenyl)iodonium silicomolybdate, dinaphthyliodonium phosphotungstate, di(4-trifluoromethylphenyl)iodonium phosphotungstate, di(2-benzothienyl)iodonium phosphotugstate, di(2-naphthyl)sulfonium phosphotungstate, and the like.

Among them, a diaryliodonium phosphotungstate such as diphenyliodonium phosphotungstate is preferably employed.

These heteropoly-acid aromatic iodonium salt may be prepared by applying the method as disclosed in "Macromolecules, Vol. 10, No. 6, p. 1307 (1977)".

A mixing amout of the heteropoly-acid aromatic sulfonium salt or the heteropoly-acid aromatic iodonium salt is preferably within 0.001 to 10 parts by weight, more preferably within 0.1 to 5 parts by weight based on 100 parts by weight of the epoxy resin. When the amount of the heteropoly-acid aromatic sulfonium salt or the heteropoly-acid aromatic iodonium salt is less than 0.1 parts by weight, the photopolymerization will not make progress to a satisfactory degree; when it is more than 10 parts by weight, there will be induced inconvenient matters such as heightened corrosive properties, increased costs and deteriorated electrical properties.

In this invention, a sensitizer may also be added, if desired.

Concrete examples of the sensitizer include:

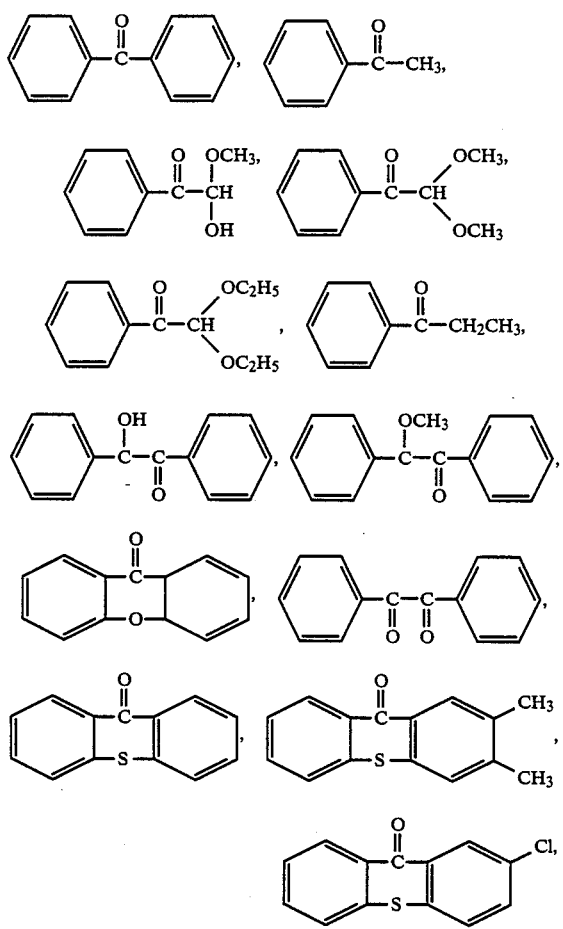

phenanthrene, naphthalene, 2-nitrofluorene, anthracene, benzoquinone, chrycene and the like. These sensitizer may preferably be mixed in an amount of 0.001 to 20% by weight based on the epoxy resin.

When preparing the composition of this invention, a phenol compound or an acid anhydride may optionally be added in addition to the above essential two components.

In this invention, a cured product having good properties can be obtained by further adding a quinone derivative.

The quinone derivative is a component having a function of regenerating the heteropoly-acid which was lowered in acidity due to the reduction by irradiation of ultraviolet light.

The quinone derivative is a compound having the following formula:

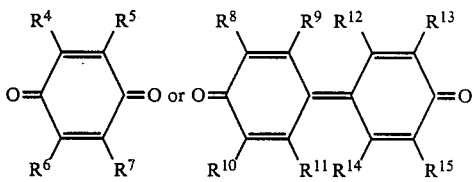

wherein $R^4$, $R^5$, $R^6$, $R^7$, $R^8$, $R^9$, $R^{10}$, $R^{11}$, $R^{12}$, $R^{13}$, $R^{14}$ and $R^{15}$ may be the same or different, and each represents a group selected from the group consisting of a hydrogen atom, a halogen atom, an alkyl group, a cyano group and a nitro group; or a pair selected from the group consisting of $R^4$ and $R^5$, $R^6$ and $R^7$, $R^8$ and $R^9$, $R^{10}$ and $R^{11}$, $R^{12}$ and $R^{13}$, and $R^{14}$ and $R^{15}$ represents an aromatic condensed ring, and concrete example thereof include p-benzoquinone, o-benzoquinone, 1,4-naphthoquinone, 2-methyl-1,4-naphthoquinone, 2,3,5,6-tetrachloro-p-benzoquinone, anthraquinone, phenanthrenequinone, 2-methylanthraquinone, benzo[a]anthraquinone, 1,2-dihydroxyanthraquinone, 4,4'-diphenoquinone, 3,3',5,5'-tetra-tert-butyl-4,4'-diphenoquinone, 3,3',5,5'-tetramethyl-4,4'-diphenoquinone and the like.

A mixing amount of the quinone derivative is preferably within 0.01 to 10 parts by weight based on 100 parts by weight of the epoxy resin. When the amount of the quinone derivative is less than 0.01 part by weight, regeneration of the photopolymerization catalyst will be insufficient; on the contrary, when it exceeds 10 parts by weight, coloring will occur or adhesive property will deteriorate.

The photopolymerizable compositions of this invention can be cured by methods such as room-temperature photocuring, high-temperature photo-curing, after-cure which is effected after the photo-curing, etc. The wavelength of light necessary for the photo-curing will generally be from 180 nm to 600 nm, preferably from 300 nm to 400 nm; the irradiation time will generally be from 0.5 sec. to 10 min., preferably from 1 sec. to 1 min., depending on the epoxy resin composition and the catalyst to be used; and the temperature in case of high-temperature photocuring will generally be from 20° C. to 200° C., preferably from 60° C. to 100° C., depending on the epoxy resin composition and the catalyst to be used. Examples of the light source to be used in this invention may include a high-pressure mercury-vapor lamp, a carbon arc lamp, a xenon lamp, an argon glow discharge tube, metal halide lamp and the like. In case after-cure which is effeeted after the photo-curing will generally be carried out at 50° C. to 200° C., preferably at 100° C. to 180° C., and effected for 1 to 10 hrs., preferably for 2 to 5 hrs., depending on the epoxy resin composition and the catalyst to be used.

The resulting cured material has extremely excellent electrical properties.

As is definite from the foregoing, the composition of this invention can exhibit (1) the photopolymerization being promptly advanced, (2) the cured product being great in hardness, (3) the corrosive action being weak, and (4) the electrical properties being excellent. Therefore, it is fair to say that an industrial utility of the composition of this invention is highly great.

A photopolymerizable composition of this invention will be described in detail as examples.

Examples 1 to 6

As epoxy resins, there were used Epikote 828 (trade name, available from Shell Kagaku K.K., Japan; bisphenol A type epoxy resin; epoxy equivalent: 190 to 210), Epikote 1001 (trade name, available from Shell Kagaku K.K., Japan; bisphol A tye epoxy resin; epoxy equivalent: 450 to 525; molecular weight: 900) and Epikote 1004 (trade name, available from Shell Kagaku K.K., Japan; bisphenol A type epoxy resin; epoxy equivalent: 900 to 1000; molecular weight : 1400), and as photopolymerizatin initiators, there were used triphenylsulfonium phosphotungstate, tri(methylphenyl)sulfonium phosphotungstate and triphenylsulfonium phosphomolybdate.

Each of these materials was uniformly mixed in compounding proportions (which were represented with "parts by weight") shown in Table 1 below in order to prepare epoxy resin compositions of this invention.

Each of these compositions was applied onto aluminum plates, and was then introduced into an ultraviolet irradiation photo-curing device in which an intensity of the irradiation was adjusted to 80 W/cm, and photo-curing was carried out for a predetermined period of time. The resultant hardness and dielectric loss tangent value (tan δ: %) at 180° C. The obtained results are shown in Table 1 all together.

TABLE 1

|  | Example | | | | | |
|---|---|---|---|---|---|---|
|  | 1 | 2 | 3 | 4 | 5 | 6 |
| Epoxy resin | | | | | | |
| Epikote 828 | 80 | 80 | 70 | 70 | 50 | 80 |
| Epikote 1001 | 20 | — | 30 | — | 20 | 20 |
| Epikote 1004 | — | 20 | — | 30 | 30 | — |
| Heteropoly-acid aromatic sulfonium salt | | | | | | |
| Triphenylsulfonium phosphotungstate | 4 | — | — | — | — | — |
| Tri(methylphenyl)sulfonium phosphotungstate | — | 4 | — | 4 | 4 | — |
| Triphenylsulfonium phosphomolybdate | — | — | 4 | — | — | — |
| Tri(2-naphthyl)sulfonium phosphotungstate | — | — | — | — | — | 3 |
| Measured value | | | | | | |
| Tan δ (%) | 3.2 | 3.1 | 3.5 | 3.2 | 4.0 | 3.9 |
| Pencil hardness | 2 H | 3 H | 2 H | 3 H | 3 H | 3 H |
| Curing time (sec.) | 30 | 30 | 30 | 45 | 45 | 30 |
| Thickness of coating film (μm) | 20 | 20 | 15 | 15 | 20 | 10 |

Examples 7 to 14

As epoxy resins, there were used Epikote 828 (trade name, available from Shell Kagaku K.K., Japan; bisphenol A type epoxy resin; epoxy equivalent: 190 to 210), Epikote 1001 (trade name, available from Shell Kagaku K.K., Japan; bisphenol A type epoxy resin; epoxy equivalent: 450 to 525; molecular weight: 900) and Epikote 1004 (trade name, available from Shell Kagaku K.K., Japan; bisphenol A type epoxy resin; epoxy equivalent: 900 to 1000; molecular weight: 1400), as heteropoly-acid aromatic iodonium salts, there were used diphenyliodonium phosphotungstate, di(methylphenyl)iodonium phosphotungstate and diphenyliodonium phosphomolybdate,and as the sensitizers, there were used dimethylthioxanthone and benzophenone.

Each of these materials was uniformly mixed in compounding proportions (which were represented with "parts by weight") shown in table 2 below in order to prepare epoxy resin compositions of this invention.

Each of these compositions was applied onto aluminum plates, and was then introduced into an ultraviolet irradiation photo-curing device in which an intensity of the irradiation was adjusted to 80 W/cm, and photo-curing was carried out for a predetermined period of time. The resultant coating films on the plates were tested for pencil hardness and dielectric loss tangent value (tan δ: %) at 180° C. The obtained results are shown in Table 2 all together.

TABLE 2

|  | Example | | | | | | | | Comparative example 1 |
|---|---|---|---|---|---|---|---|---|---|
|  | 7 | 8 | 9 | 10 | 11 | 12 | 13 | 14 | |
| Epoxy resin | | | | | | | | | |
| Epikote 828 | 100 | 80 | 80 | 60 | 60 | 50 | 70 | 80 | 100 |
| Epikote 1001 | — | 20 | — | 40 | 20 | 50 | 20 | 20 | — |
| Epikote 1004 | — | — | 20 | — | 20 | — | 10 | — | — |
| Heteropoly-acid aromatic iodonium salt | | | | | | | | | |
| Diphenyliodonium phosphomolybdate | 2 | — | — | 2 | — | — | 2 | — | 2 |
| Diphenyliodonium phosphotungstate | — | 2 | — | — | 2 | — | — | — | — |
| Di(methylphenyl)iodonium phosphomolybdate | — | — | 2 | — | — | 2 | — | — | — |
| Di(2-naphthyl)iodonium phosphotungstate | — | — | — | — | — | — | — | 2 | — |
| Sensitizer | | | | | | | | | |
| Dimethylthioxanthone | 1 | 1 | 1 | — | — | 1 | — | 1 | — |
| Benzophenone | — | — | — | 1 | 1 | — | 1 | — | — |
| Measured value | | | | | | | | | |
| Curing time (sec.) | 30 | 30 | 50 | 30 | 30 | 60 | 60 | 40 | 60 |
| Tan δ (%) | 2.5 | 3.0 | 2.7 | 2.9 | 2.1 | 3.4 | 3.5 | 2.9 | 3.1 |
| Pencil hardness | 4H | 4H | 5H | 4H | 4H | 4H | 4H | 3H | 3H |
| Thickness of coating film (μm) | 20 | 10 | 15 | 15 | 15 | 10 | 10 | 10 | 20 |

Examples 16 to 20

As epoxy resins, there were used ERL 4221 (trade name, available from Union Carbide Co.; 3',4'-epoxy-cyclohexylmethyl-3,4-epoxy-cyclohexanecarboxylate), Epikote 828 (trade name, available from Shell Kagaku K.K., Japan; bisphenol A type epoxy resin; epoxy equivalent: 190 to 210), Epikote 1001 (trade name, available from Shell Kagaku K.K., Japan; bisphenol A type epoxy resin; epoxy equivalent: 450 to 525; molecular weight: 900), Epikote 1004 (trade name, available from Shell Kagaku K.K., Japan; bisphenol A type epoxy resin; epoxy equivalent: 900 to 1000; molecular weight: 1400), ERL 4206 (trade name, available from Union Carbide Co.; vinylcyclohexenedioxide) and CY 175 (trade name, available from Ciba Geigy A.G.; alicyclic epoxide), as heteropoly-acid aromatic iodonium salts, there were used diphenyliodonium phosphotungstate, di(methylphenyl)iodonium phosphomolybdate and diphenyliodonium phosphomolybdate, and as quinone drivatives, there were used p-benzoquinone and 1,4-naphthoquinone.

Each of these materials was uniformly mixed in compounding proportions (which were represented with "parts by weight") shown in Table 3 below in order to prepare epoxy resin compositions of this invention.

Each of these compositions was applied onto aluminum plates, and was then introduced into an ultraviolet irradiation photo-curing device in which an intensity of the irradiation was adjusted to 800 W/cm, and photo-curing was carried out for a predetermined period of time.

The resultant coating films on the plates were tested for pencil hardness and dielectric loss tangent value (tan $\delta$: %) at 180° C. The obtained results are shown in Table 3 all together.

A epoxy resin (Celloxide 2021; trade name, available from Daisel K. I., alicyclic epoxy resin) which was photocured (80 W/cm, at a distance of 15 cm for 1 minute) with a catalyst (tri(methyoxyphenyl)sulfonium silicotungstate: 1 phr) was crushed into powder having particle size between 100 meshs to 300 meshes. After 50 g of the thus prepared powders were placed in a 500 cc of distilled water and refluxed for an hour, the mixture was filtrated to obtain an aqueous filtrate. An iron plate which was covered wth Capton tape (trade name; available from Teraoka Seisakusho Co.) leaving a not covered area of 2 cm×1, was inserted into the filtered aqueous solution to measure the corrosive speed.

On the other hand, the same procedures were repeated except that the catalyst was replaced with UVE 1014 (aromatic sulfonium hexafluoroantimonate, available from GE) to prepare Comparative sample 4.

As the results, in the case of epoxy resin composition of this invention, an initial corrosive speed was 9 mg/day/(dm)$^2$ whereas the Comparative sample 4 being 100 mg/day/(dm)$^2$. Therefore, it is confirmed that the catalyst system of this invention is smaller in corrosive speed than that of the Comparative sample.

As is definite from the foregoing, the composition of this invention can exhibit the effects of the photopolymerization being promptly advanced; the cured product being great in hardness; and the electrical properties being excellent. Therefore, it is fair to say that an industrial utility thereof is hightly great.

We claim:

1. A photopolyermizable epoxy resin composition comprising (A) an epoxy resin having more than one oxirane group and (B) a salt comprised of an anion of a heteropoly acid and an aromatic sulfonium or an aromatic iodonium cation, wherein (i) said anion is selected from the group consisting of

TABLE 3

| | Example | | | | | | Comparative example | |
|---|---|---|---|---|---|---|---|---|
| | 15 | 16 | 17 | 18 | 19 | 20 | 2 | 3 |
| Epoxy resin | | | | | | | | |
| Epikote 828 | — | — | 30 | 20 | 50 | — | — | — |
| Epikote 1001 | — | — | 20 | — | 20 | 30 | — | — |
| Epikote 1004 | — | — | — | 20 | — | — | — | — |
| ERL 4221 | 50 | 50 | 50 | 50 | 30 | 50 | 50 | 50 |
| ERL 4206 | 50 | — | — | — | — | 20 | 50 | — |
| CY 175 | — | 50 | — | 10 | — | — | — | 50 |
| Heteropoly-acid aromatic iodonium salt | | | | | | | | |
| Diphenyliodonium phosphomolybdate | — | — | 5 | — | — | — | — | — |
| Diphenyliodonium phosphotungstate | 4 | — | — | 4 | 5 | 5 | 4 | — |
| Di(methylphenyl)iodonium phosphomolybdate | — | 4 | — | — | — | — | — | 4 |
| Quinone derivative | | | | | | | | |
| p-Benzoquinone | 2 | 2 | — | 1 | 1 | 2 | — | — |
| 1,4-Naphthoquinone | — | — | 2 | — | — | — | — | — |
| Measured value | | | | | | | | |
| Tan $\delta$ (%) at 180° C. | 3.6 | 5.2 | 4.5 | 2.9 | 3.0 | 3.5 | 3.3 | 5.0 |
| Pencil hardness | 5H | H | 2H | 3H | 3H | 3H | 3H | H |
| Curing time (sec.) | 5 | 2 | 5 | 3 | 5 | 5 | 25 | 15 |
| Thickness of coating film ($\mu$m) | 20 | 20 | 10 | 20 | 10 | 20 | 20 | 20 |

Example 21

Corrosivity to iron of the epoxy resin compositions of this invention was measured with the Coulostatt method.

a phosphotungstate anion, a phosphomolybdate anion, a tungstogermanate anion, silicotungstate anion and a silicomolybdate anion, and (ii) said salt is selected from the group consisting of
(a) a compound represented by the formula:

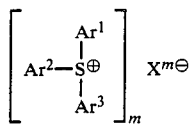

wherein Ar¹ to Ar³ are the same or different from each other, and each represents an aromatic group which is unsubstituted or substituted with at least one substituent selected from the group consisting of a halogen atom, an alkyl group, an alkoxy group, an aralkyl group, an aryloxy group, an arylthio group and a nitro group; $X^{m\ominus}$ represents said anion; and m is an integer of 3 to 5, and (b) a compound represented by the formula

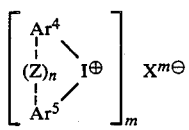

wherein Ar⁴ and Ar⁵ are the same or different from each other, and each represents a substituted or unsubstituted aromatic group or heterocyclic group having 6 to 20 carbon atoms; Z represents the optional presence of an oxygen atom, a sulfur atom,

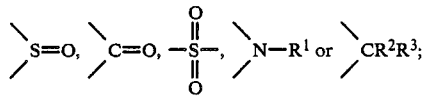

where
R¹ represents a hydrogen atom, an alkyl group having 1 to 10 carbon atoms or an acyl group having 1 to 5 carbon atoms,
and R² and R³ are the same or different from each other, and each represents a hydrogen atom, an alkyl group having 1 to 4 carbon atoms or an alkenyl group having 2 to 4 carbon atoms;
$X^{m\ominus}$ represents said anion; m is the same as defined above; n is an integer of 0 or 1; and the dotted line represents the optional presence of bonding when n=1.

2. The photoplymerizable epoxy resin composition according to claim 1, wherein the epoxy resin comprising at least one epoxy resin selected from the group consisting of a bisphenol A type epoxy resin, a bisphenol F type epoxy resin, a phenol-novolac type epoxy resin, an alicyclic epoxy resin, a heterocyclic ring-containing epoxy resin, a hydrogenated bisphenol A type epoxy resin, an aliphatic epoxy resin, a glycidyl ester type epoxy resin, a spiro ring-containing epoxy resin and a glycidyl ether type epoxy resin.

3. The photopolymerizable epoxy resin composition according to claim 1, wherein the heteropoly-acid aromatic sulfonium salt represents a compound selected from the group consisting of triphenylsulfonium phosphomolybdate, triphenylsulfonium phosphotungstate, triphenylsulfonium silicotungstate, tri(methyoxyphenyl)sulfonium phosphotungstate, tri(methyoxyphenyl)sulfonium silicomolybdate, tri(tert-butylphenyl)sulfonium phosphotungstate, tritolylsulfonium phosphotungstate and tri(2-naphthyl)sulfonium phosphotungstate.

4. The photopolymerizable epoxy resin composition according to claim 1, wherein the salt comprises a compound selected from the group consisting of diphenyliodonium phosphomolybdate, diphenyliodonium phosphotungstate, di(4-methylphenyl)-iodonium phosphosilicotungstate, di(4-heptylphenyl)iodonium tungstogermanate, di(5-nitrophenyl)iodonium phosphotungstate, di(4-chlorophenyl)iodonium silicomolybdate, dinaphthyliodonium phosphotungstate, di(4-trifluoromethylphenyl)iodonium phosphotungstate, di(benzothienyl) iodonium phosphotungstate and di(2-naphthyl)-sulfonium phosphotungstate.

5. The photopolymerizable epoxy resin composition according to claim 1, wherein the amount of salt is within the range of 0.001 to 10 parts by weight based on the 100 parts by weight of the epoxy resin.

6. The photopolymerizable epoxy resin composition according to claim 5, wherein the amount of salt is within the range of 0.1 to 5 parts by weight based on the 100 parts by weight of the epoxy resin.

7. The photopolymerizable epoxy resin composition according to claim 1, further comprising a sensitizer.

8. The photopolymerizable epoxy resin composition according to claim 7, wherein the sensitizer comprises a compound selected from the group consisting of

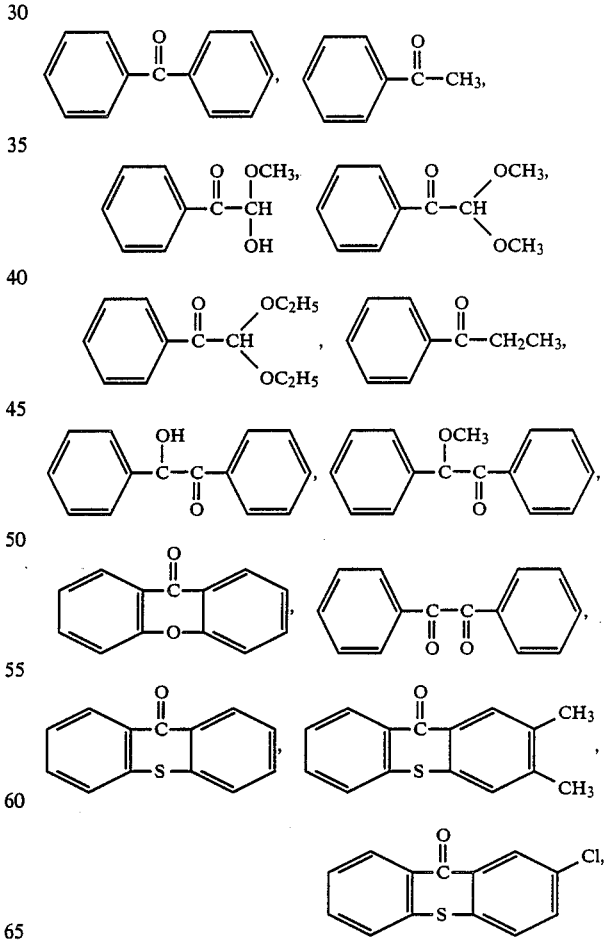

phenanthrene, naphthalene, 2-nitrofluorene, anthracene, benzoquinone and chrycene.

9. The photopolymerizable epoxy resin composition according to claim 7, wherein the amount of the sensitizer is within the range of 0.001 to 20 % by weight based on the epoxy resin.

10. The photopolymerizable epoxy resin composition according to claim 7, wherein the composition comprises an epoxy resin having more than one oxirane group; a salt comprised of an anion of a heteropoly acid and an aromatic iodonium cation; and a sensitizer.

11. The photopolymerizable epoxy resin composition according to claim 1, further comprising a quinone derivative.

12. The photopolymerizable epoxy resin composition according to claim 11, wherein the quione derivative comprises a compound represented by the formula:

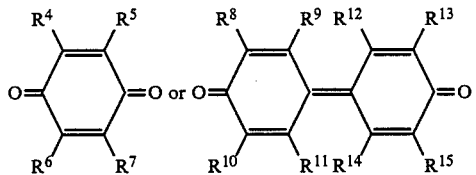

wherein $R^4$, $R^5 R^6$, $R^7$, $R^8$, $R^9$, $R^{10}$, $R^{11}$, $R^{12}$, $R^{13}$, $R^{14}$ and $R^{15}$ are the same or are different, and each represents a group selected from the group consisting of a hydrogen atom, a halogen atom, an alkyl group, a cyano group and a nitro group; or a pair selected from the group consisting of $R^4$ and $R^5$, $R^6$ and $R^7$, $R^8$ and $R^9$, $R^{10}$ and $R^{11}$, $R^{12}$ and $R^{13}$, and $R^{14}$ and $R^{15}$ represents an aromatic condensed ring.

13. The photopolymerizable epoxy resin composition according to claim 11, wherein the quinone derivative comprises a compound selected from the group consisting of p-benzoquinone, o-benzoquinone, 1,4-naphthoquinone, 2-methyl-1,4-naphthoquinone, 2,3,5,6-tetrachloro-p-benzoquinone, anthraquinone, phenanthrenequinone, 2-methyl-anthraquinone, benzo anthraquinone, 1,2-dihydroxyanthraquinone, 4,4'-diphenoquinone, 3,3',5,5'-tetra-tert-butyl-4,4'-diphenoquinone and 3,3',5,5'-tetramethyl-4,4'-diphnoquinone.

14. The photopolymerizable epoxy resin composition according to claim 11, wherein the amount of the quinone derivative is within the range of 0.01 to 10 parts by weight based on the 100 parts by weight of the epoxy resin.

15. The photopolymerizable epoxy resin composition according to claim 11, wherein the composition comprises an aromatic iodonium salt of a heteropoly acid.

16. The photopolymerizable epoxy resin composition according to claim 1, wherein the salt is tri(methylphenyl) sulfonium phosphotungstate.

* * * * *